United States Patent [19]

Kosonocky et al.

[11] 3,967,254
[45] June 29, 1976

[54] CHARGE TRANSFER MEMORY

[75] Inventors: Walter Frank Kosonocky, Skillman; Donald Jon Sauer, Plainsboro, both of N.J.

[73] Assignee: RCA Corporation, New York, N.Y.

[22] Filed: Nov. 18, 1974

[21] Appl. No.: 524,830

[52] U.S. Cl. .............................. 340/173 R; 307/238
[51] Int. Cl.² ........................................ G11C 11/40
[58] Field of Search ............ 340/173 R; 307/221 C, 307/238

[56] References Cited
UNITED STATES PATENTS

| | | | |
|---|---|---|---|
| 3,643,106 | 2/1972 | Berwin | 340/173 R |
| 3,763,480 | 10/1973 | Weimer | 340/173 R |
| 3,797,002 | 3/1974 | Brown | 340/173 R |

*Primary Examiner*—Terrell W. Fears
*Attorney, Agent, or Firm*—H. Christoffersen; Samuel Cohen

[57] ABSTRACT

Output gate electrode structure between the storage matrix and the output register of a serial-parallel-serial (SPS) charge coupled device (CCD) memory. To permit high channel packing density in the matrix, the output register can have as few as M/N stages, where M is the number of channels in the matrix and N the number of phases employed for operating the register. The gate structure transfers 1/N'th of a word at a time to the output register and while this 1/N'th of a word is being propagated out of the register, the remaining part (or parts), if any, of the word are stored while the gate structure provides a potential barrier between this stored charge and the register.

5 Claims, 12 Drawing Figures

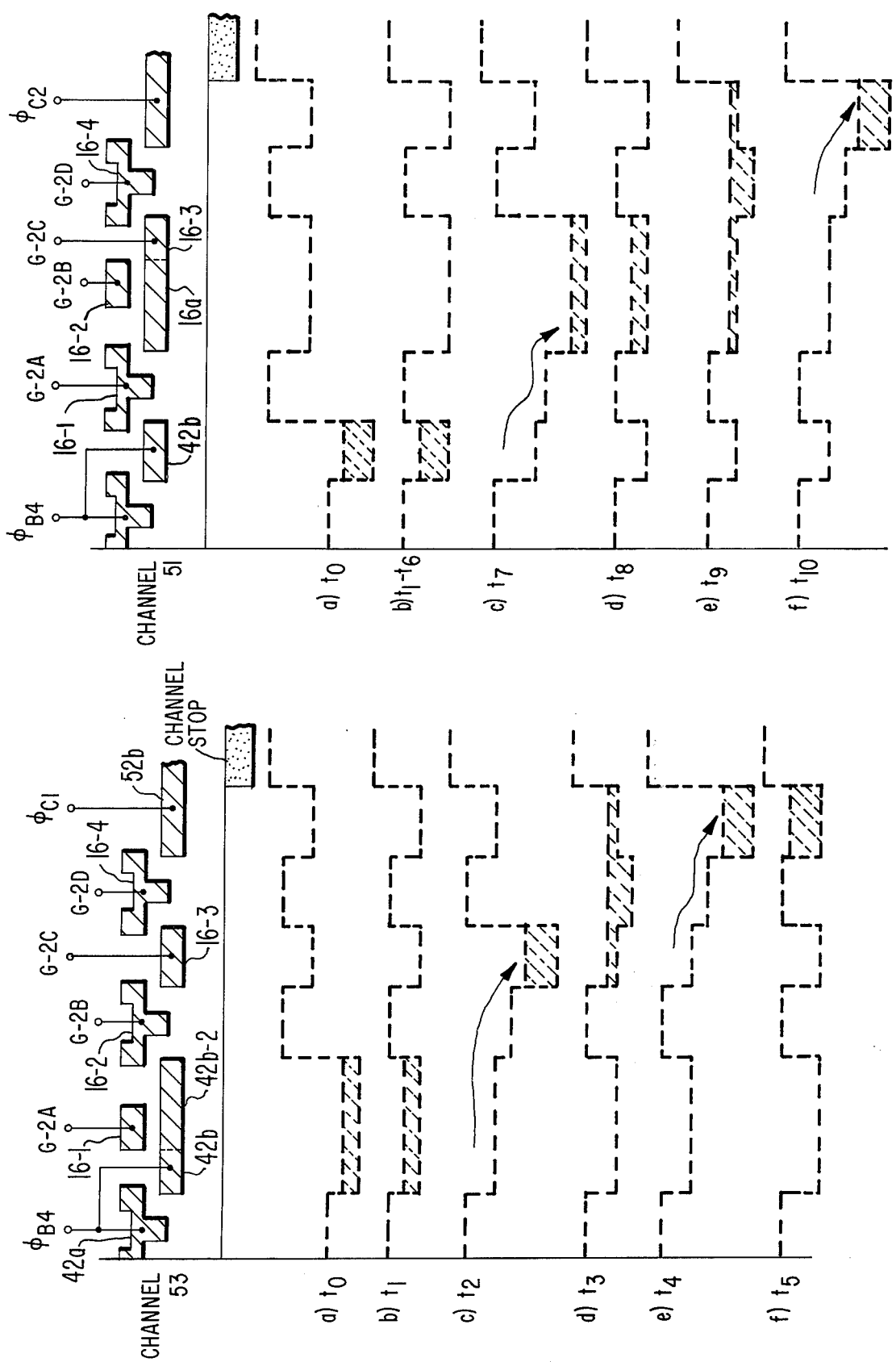

CHARGE TRANSFER MEMORY

The amount of information which can be stored in a given area of a charge-coupled device (CCD) memory of the serial-parallel-serial type is a function, among other things, of how close the channels can be placed to one another, center-to-center. In such a memory, the words are shifted, in parallel from the storage matrix to the output register. Accordingly, it is normal practice to align each channel of the matrix with a different stage of the output register. This means that the channels can be placed no closer to one another, center-to-center, than the length of a stage in the output register.

In the system of the present application, each channel of the matrix requires less than a complete stage and in the limiting case is aligned with only 1/N'th of a register stage, where N is the number of phases employed to drive the output register. The gate structure coupling the last row of the matrix to the output register includes means for transferring the contents of this last row into the register 1/N'th to ½ of a word at a time. It also includes means for storing the remainder of the word, if any, while a part of a word is being shifted out of the output register, and means for providing a potential barrier between the last row and the output register during such shifting.

The invention is illustrated in the drawing of which:

FIGS. 4 and 5 illustrate surface potential profiles obtained during the operation of the arrangement of FIG. 2;

The present application deals mainly with the output structure for transferring the successive rows of information from a high density charge coupled device memory to the output register of the memory. However, to provide a clearer understanding of where in a complete system, the present invention fits and the problem solved by the invention, a complete CCD memory system, which itself is new in a number of respects, will be discussed first.

Figure 1:
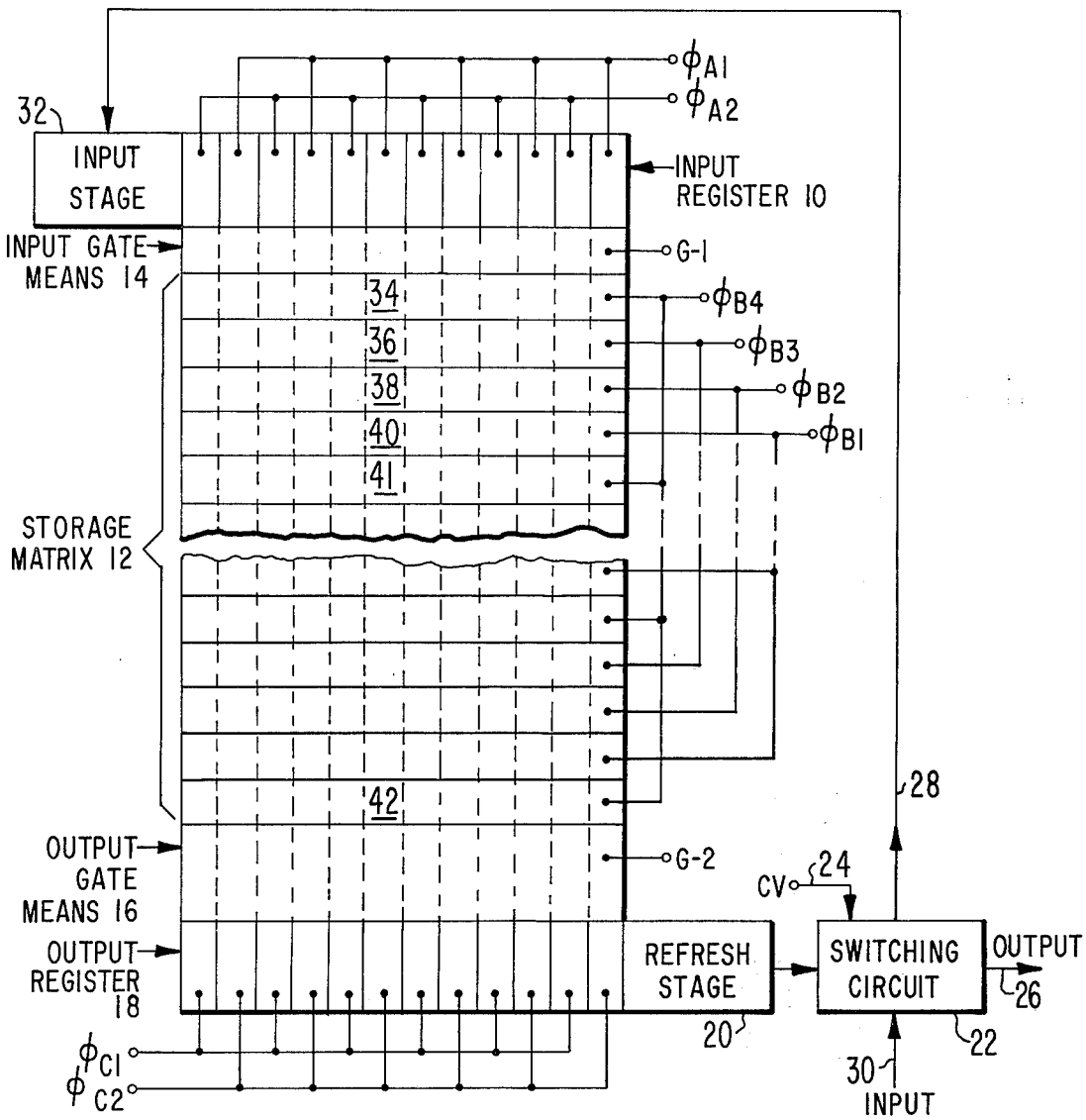
FIG. 1 is a schematic showing of a serial-parallel-serial (SPS) memory embodying the invention.

Such a system is shown in FIG. 1. It includes an input register 10, a storage matrix 12 and input gate means 14 for transferring information in parallel from the input register to the storage matrix. The system also includes an output gate means 16 shown schematically as a single structure but which in the embodiments of the present invention to be discussed in more detail later actually comprises a plurality of gate electrodes.

The means 16 transfers information stored beneath the last electrode of the matrix 12 to the output register 18. The contents of the output register is transferred serially via the refresh stage 20 of the output register to the switching circuit 22.

The switching circuit may include transistor circuits and/or various CCD structures. These, in response to one or more control voltages, represented schematically by the legend CV applied to the lead 24, transfer the charge signals supplied by the refresh stage 22 either to the output lead 26 or to the lead 28 to the input stage 32. It is to be appreciated that there may be more than one control voltage CV and more than one lead 24. The switching circuit 22 is also capable of accepting input information via lead 30.

In the operation of the system of FIG. 1, to start with serial input information is applied via lead 30 and switching circuit 22 to the input stage 32 of input register 10. This register may be a two phase register, as shown, and it has half the number of stages as there are channels in the storage matrix 12. In the example of FIG. 1, the register has six stages and there are twelve channels in the matrix. [A two phase register stage has one phase one ($\phi_{A1}$) electrode means and one phase two ($\phi_{A2}$) electrode means.]

Figure 8:
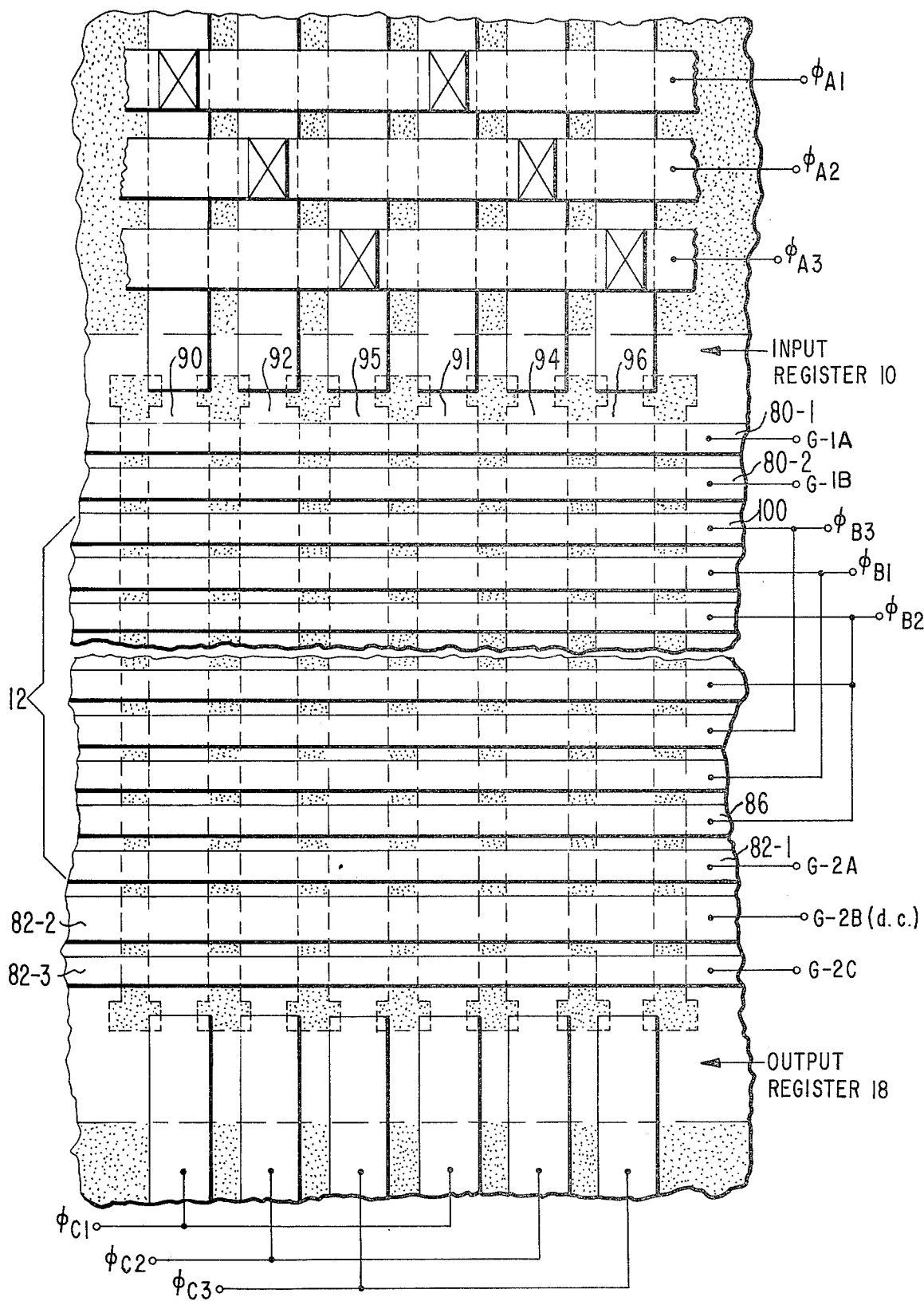
FIG. 8 is a plan view of a SPS CCD memory embodying another form of the invention.

When the input register is full (6 charge packets, and these may be assumed to be stored beneath the $\phi_{A1}$ electrodes) and the 6 charge packets are transferred via the input gate means 14 to beneath the first electrode 34 of the matrix. The transfer is accomplished by applying the pulse G-1 to the input gate means. (In practice, element 14 may be a single gate electrode or it may comprise two electrodes. In the latter case, G-1 represents two control pulses G-1A and G-1B for operating the two electrodes, respectively. Such a structure is shown in FIG. 8 and discussed later.) In the present example, assuming an N-type substrate (P channel) and surface channel operation (holes as the minority carriers) the transfer pulse (or pulses) G-1 are negative. It is also assumed that electrode 34 is at a negative potential at this time and the remaining phase B electrodes are relatively more positive.

After the first half row of information is transferred in the manner described, the second half row of signals is serially applied via lead 30, switching circuit 22 and input stage 32 to the input register 10. The gate means 14 is held at a potential to isolate the register from the electrode 34 during this transfer. The multiple phase voltages $\phi_{A1}$ and $\phi_{A2}$ applied to effect the transfer cause the second half word to end up stored beneath the $\phi_{A2}$ electrodes of the input register 10. Now, when the pulse (or pulses) G-1 are applied, this second half word is transferred to beneath electrode 34, interleaved with the first half word, so that the complete word is stored at 34. Now, $\phi_{B4}$, is made more positive than $\phi_{B3}$ then is made negative to transfer the first row of information from beneath electrode 34 to beneath electrode 36.

Now the same process is repeated for the first half of the second word, then for the second half of the second word, then for the first half of the third word and the second half of the third word. When this is completed, the entire first word will be stored beneath electrode 38, the entire second word beneath electrode 36 and the entire third word beneath electrode 34. The fourth word in this embodiment is all zeros and this may be simulated simply by applying the $\phi_{B4}$ pulse. This transfers to beneath electrode 41 the charge beneath electrode 40 so that no charge remains beneath electrode 40. At the same time the new word present in register 10 is transferred via gate means 14 to beneath electrode 34 and so on. So, of the first five rows, there is charge signal present beneath row 1—3 and 5 (beneath electrodes 34, 36, 38 and 41) and no charge signal present in row 4 (beneath electrode 40).

All of the above steps are now repeated a sufficient number of times completely to fill the storage matrix 12; that is, to fill three of each group of four rows, leaving one of the four empty.

Now the problem is present of how to transfer each word from beneath electrode means 42 to the output register 18. In the present example, a half word is transferred at a time through the output gate means 16 to the output register. After each half word is received by the output register, it is serially propagated out of this register and the next half word then is transferred, in parallel, from beneath electrode 42 to the output register 18. This technique gives rise to a problem that clearly is considerably different than that which is present when transferring input half words into the matrix. In the latter case, there is only half word stored at a time in the input register 10. If the half word is stored under the $\phi_{A1}$ electrodes, then it will be transferred into one group of alternate channels beneath electrode 34 of matrix 12; if stored under the $\phi_{A2}$ electrodes, it will be transferred to the other group of alternate channels beneath electrode 34. In the case of the transfer to the output register 18, the full word is present and means must be provided for transferring only one half of this word and preventing the other half, which is interleaved with the first half, from propagating to the output register and from being disturbed during the dynamic operation of the output register.

Figure 2:
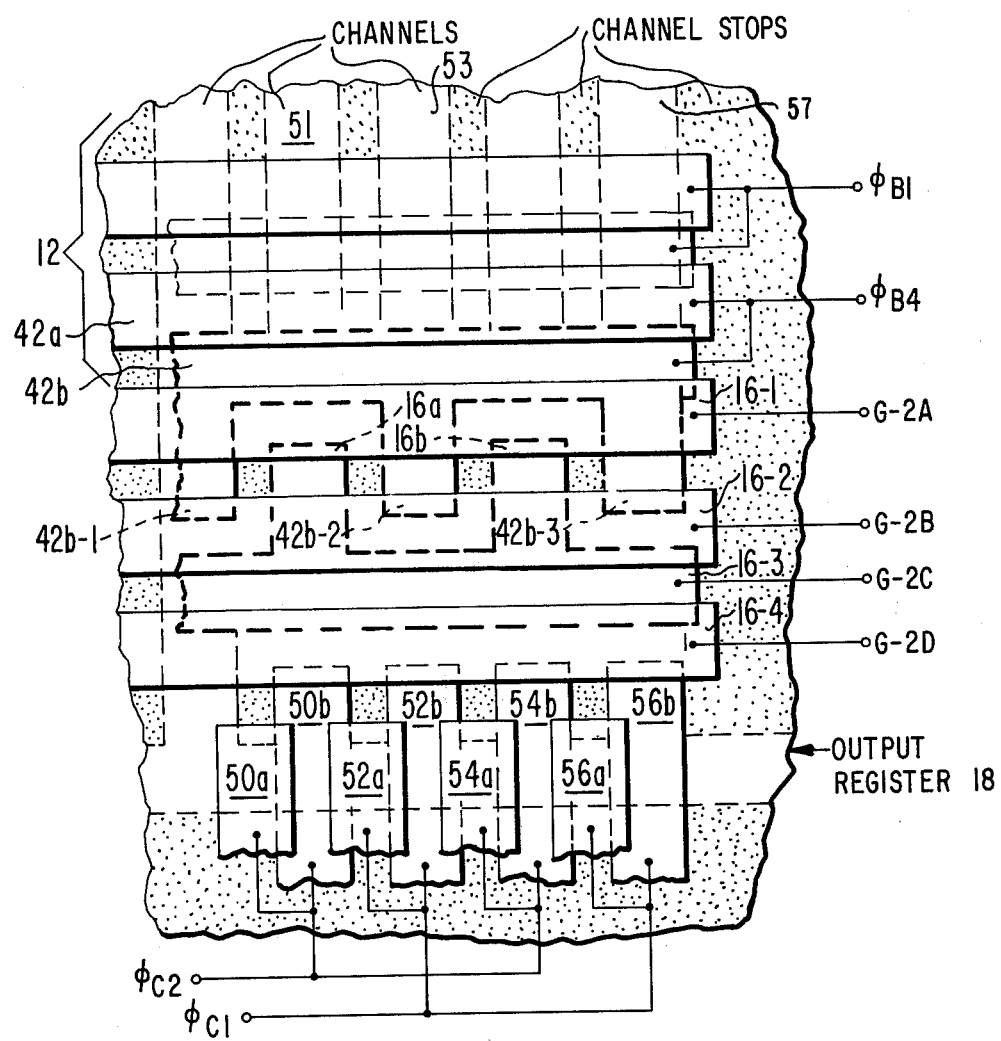
FIG. 2 is a plan view of a portion of the memory of FIG. 1 showing the details of the output gate structure.

FIG. 2 shows one solution of the present invention to the problem discussed above. Only the last two electrode means of the storage matrix 12 are shown. As may be observed, electrode means 42 consists of an electrode pair 42a, 42b with electrode 42b closer to the substrate than electrode 42a. Thus, electrode 42a performs the functions of a transfer electrode and electrode 42b performs the function of a storage electrode. Both electrodes may be formed of polysilicon or one or the electrodes such as 42a may be formed of a metal such as aluminum and the other electrode 42b formed of polysilicon. The electrode 42b is not simply of rectangular shape. Rather, it includes fingers, three of which, 42b–1, 42b–2 and 42b–3, are shown. The gate electrode means 16 of FIG. 1 comprises four separate electrodes 16–1, 16–2, 16–3 and 16–4. Electrodes 16–1, 16–2 and 16–4 are of rectangular shape. However, electrode 16–3 has fingers, two of which, 16a and 16 b, are shown, which interleave with the fingers of electrode 42b. The fingers 16a and 16b extend beneath electrode 16–1 and the fingers of electrode 42b extend beneath electrode 16–2.

The output register 18 also is formed of electrode pairs. In each case, the electrode of the pair which is closer to the substrate aligns with the channel. Thus, electrode 50b aligns with channel 51; electrode 52b aligns with channel 53 and so on. As in the case of the matrix, the construction may be all polysilicon or the electrodes spaced further from the substrate (the transfer electrodes) may be made of a metal such as aluminum, and those closer to the substrate may be made of polysilicon.

Figure 3:
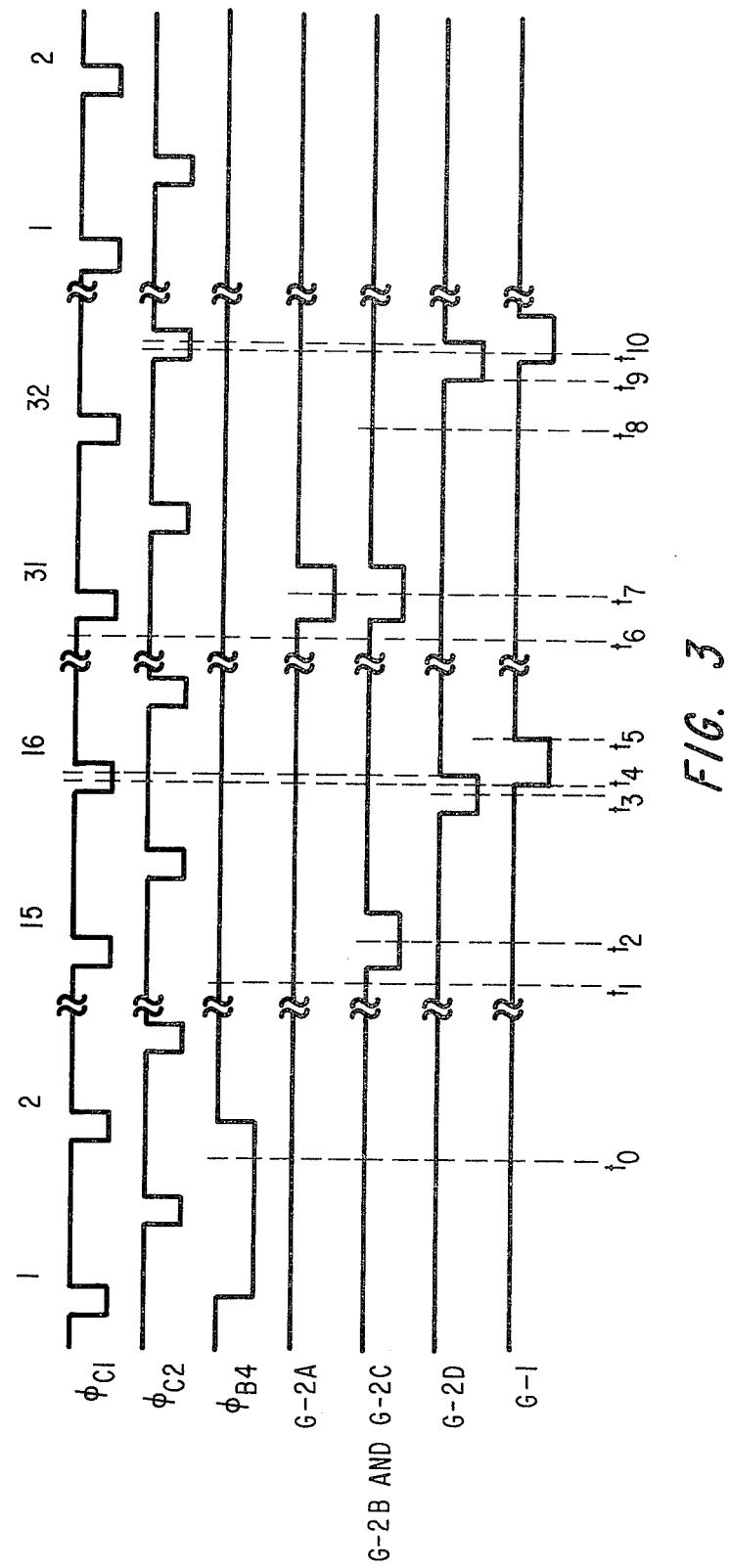
FIG. 3 is a drawing of waveforms to help explain the operation of the arrangement of FIG. 2.

The operation of the structure of FIG. 2 is illustrated in FIGS. 3, 4 and 5. First, the channels leading to the $\phi_{C1}$ electrodes of the output register, that is, to the electrode 52 and 56 will be considered. The surface potential profiles for the channel 53 electrodes leading to 52b are illustrated in FIG. 4. As may be observed from FIG. 3, the assumption made for purposes of this explanation is that there are 32 channels in the array and that the input and output registers each have 16 stages.

It is assumed that at time $t_0$ a complete row of information (a complete "word") is stored beneath electrode 42b. Time $t_0$ is the "bit two" time. At time $t_1$, which is immediately before the bit 15 time, the $\phi_{B4}$ voltage has returned to its quiescent value. However, the substrate biasing and/or the quiescent voltage applied to the electrode pair 42a, 42b is such that a potential well remains beneath electrode 42b and the charge packets previously stored there remain stored there. At time $t_2$, the voltages G-2B and G-2C are negative. The finger 42b–2 of electrode 42b extends beneath the electrode 16–2 to which the G-2B voltage is applied. Therefore, the potential well beneath this electrode 16–2 is adjacent to the residual well beneath 42b–2 so charge propagates to the well beneath electrode 16–2. From there it propagates to the deeper well beneath electrode 16–3 as illustrated at C in FIG. 4.

At time $t_3$, the voltage G-2D is negative, so the charge formerly stored beneath electrode 16–3 passes to beneath electrode 16–4 and electrode 52b, as shown at d in FIG. 4. At time $t_4$, the voltage $\phi_{C1}$ is negative and the voltage G-2D still is negative so that the charge present beneath electrode 16–4 propagates to beneath electrode 52b in the output register.

Recapitulating the above, in alternate channels such as 53 and 57, the charge signal stored beneath electrode 42b of the matrix 12 has propagated to the $\phi_{C1}$ electrodes, such as 52b and 56b, of the output register 18. Subsequent to this, the successive $\phi_{C1}$ and $\phi_{C2}$ multiple phase voltages propagate the half row of information out of the output register through the refresh stage 20 of FIG. 1 to the switching circuit 22. During this transfer (bit 16 to bit 32 time), G-2D is relatively positive so that the second half of the word stored by electrode means 16, as soon discussed, is not disturbed by the $\phi_{C1}$ and $\phi_{C2}$ voltages. From there, depending upon the value of the control voltage (or control voltages) CV, the half word is either passed to the output lead 26 (FIG. 1) or recirculated, or both.

FIG. 5 illustrates what occurs in the remaining channels of array 12. At time $t_0$, the situation is the same as is shown in FIG. 4. However, note that in a channel such as 51, the electrode 42b has no extension. But, the electrode 16–3 does have a finger 16a.

During the time $t_1$–$t_6$ there is a potential barrier beneath electrode 16–1. Therefore, the information stored beneath electrode 42b in channel 51 remains stored there. It should also be kept in mind that by the time $t_6$, the half word stored beneath electrode 42b in channels such as 53 has been transferred to the output register 18 and is being propagated out of the output register.

At bit time 31 (time $t_7$), the voltages G-2A, G-2B and G-2C have gone low. This has caused the information present beneath electrode 42b to transfer to beneath electrode 16–3. This is shown at C in FIG. 5. At time $t_8$, the various voltages of interest are at their quiescent value and charge remains stored beneath electrode 16–3. At time $t_9$, the voltage G-2D goes negative and this causes the transfer of charge to beneath electrode 16-4. A short time later, while the voltage G-2D is still negative, the $\phi_{C2}$ pulse goes negative and the pulse G-2D terminates while $\phi_{C2}$ still is negative. The result is as shown at $f$ of FIG. 5 which depicts the potential profile at time $t_{10}$ of FIG. 3.

Summarizing the above, at time $t_{10}$, which is after the first half word has been transferred out of the output register 18, the second half word is transferred into the output register. Thus, all of the information (one complete word) has now been removed from beneath electrode 42b. Subsequently, $\phi_{B1}$ and $\phi_{B4}$ go negative to transfer another full word to beneath electrode 42b. Also, the successive $\phi_{C2}$, $\phi_{C1}$ voltages propagate the half word stored in the output register via the refresh stage 20 of FIG. 1 to the switching circuit 22.

Figure 6:
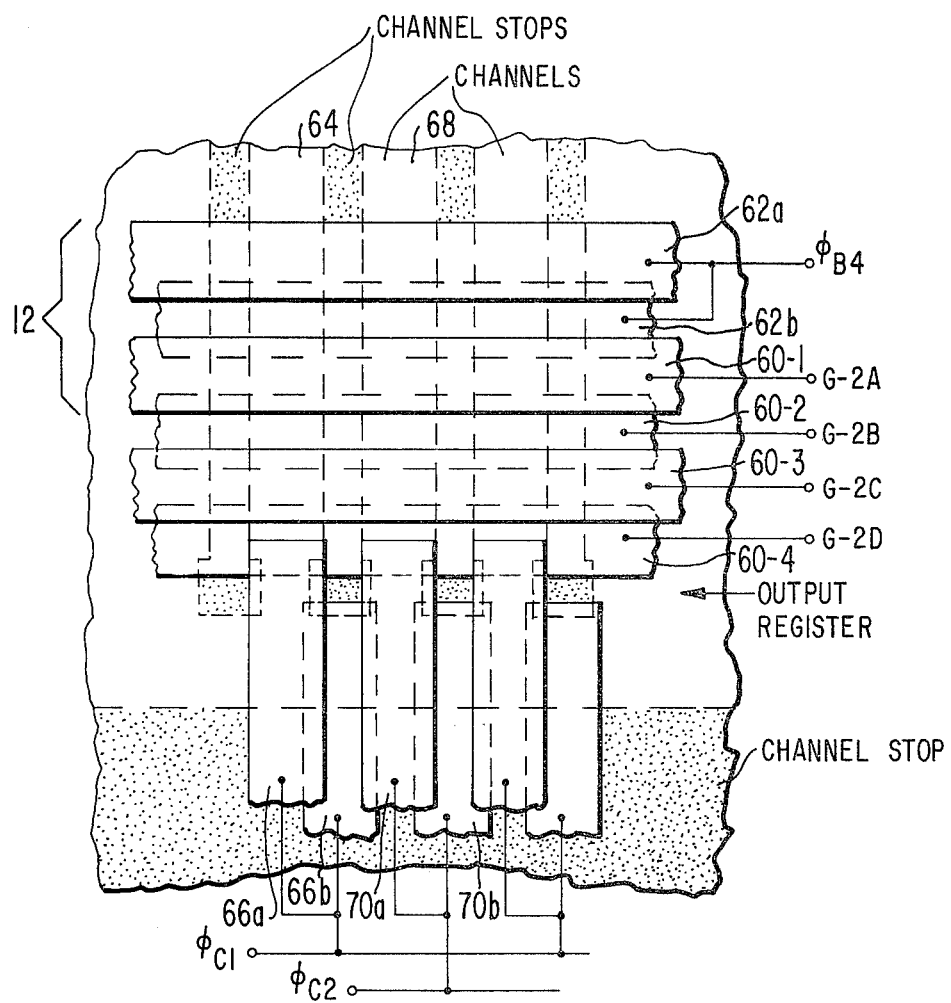
FIG. 6 is a plan view of the output gate structure of another embodiment of the invention.
Figure 7:
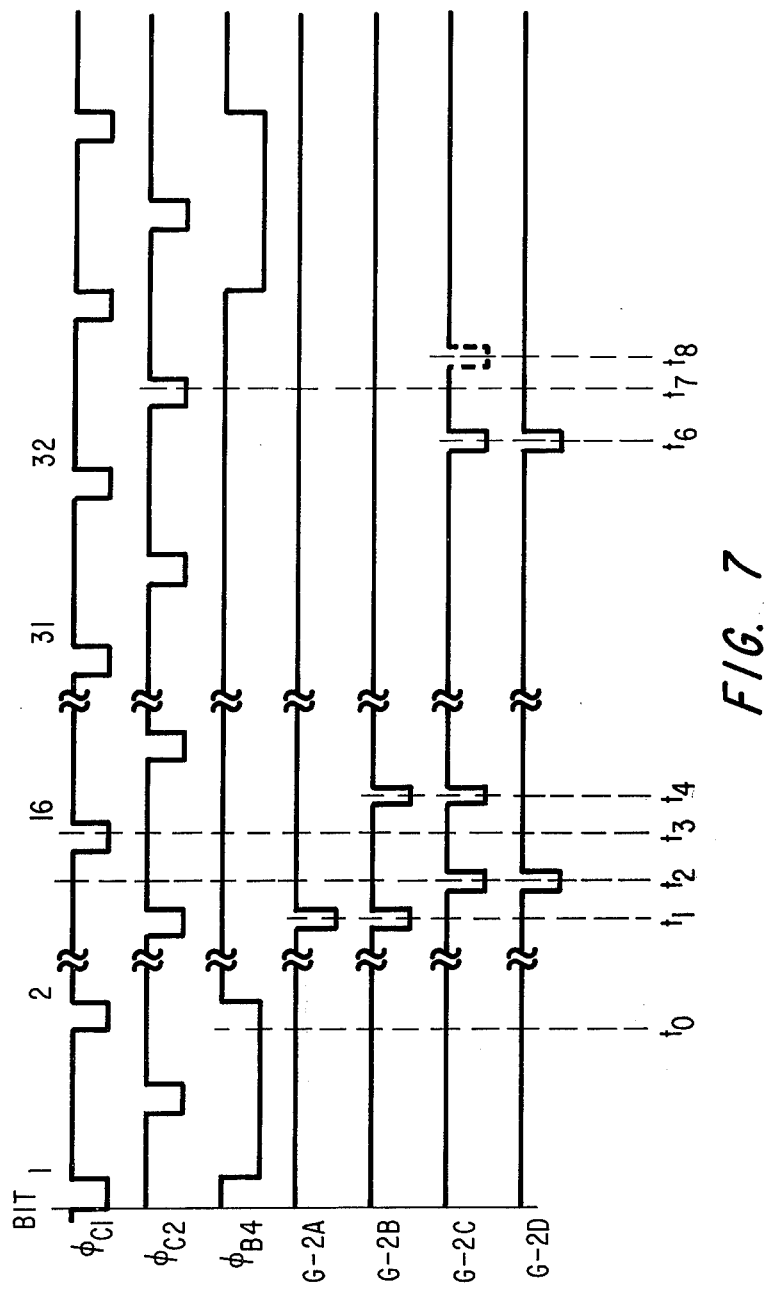
FIG. 7 is a drawing of waveforms to help explain the operation of the arrangement of FIG. 6.

A modified form of output gating structure is shown in FIG. 6. Here, the four gate electrodes 60-1, 60-2, 60-3 and 60-4 are all of rectangular shape and the operation is somewhat different than that of the embodiment of FIG. 2. Such operation may be better understood from the waveforms of FIG. 7.

At time $t_0$, charges representing one complete row of information are assumed to be stored beneath the last gate electrode 62b of the matrix 12. At time $t_1$, the pulses G-2A and G-2B are present so that these charges propagate to beneath electrode 60-2. At time $t_2$, the pulses G-2C and G-2D are present so that the charges formerly stored beneath electrode 60-2 now are stored beneath electrode 60-4. At time $t_3$, the $\phi_{C1}$ pulse is present so that the charges present in channels leading to the $\phi_{C1}$ electrodes pass to beneath these electrodes. Thus, for example, the charge present in channel 64 passes to beneath electrode 66a and from there passes to the deeper well beneath electrode 66b.

A short time later, at time $t_4$, which is prior to the start of the next $\phi_{C2}$ pulse, the G-2B and G-2C pulses are again applied. This causes the half word that remained stored beneath electrode 60-4 to return to beneath the electrode 60-2. The purpose of returning this half word to beneath electrode 60-2 is to prevent the $\phi_{C2}$ voltage from causing these charge signals to pass from beneath electrode 60-4 to beneath the $\phi_{C2}$ electrodes of the output register during the propagation of the half word stored in the output register to the output circuit of this register. After the half word has been returned to the electrode 60-2, the half word present in the output register is propagated to the right in FIG. 6 until the register is empty. During such propagation, G-2D is relatively positive to provide a potential barrier between the output register and the residual potential wells beneath electrodes 60-2 and 60-3.

At time $t_6$, after the output register is emptied of the first half word, the pulses G-2C and G-2D again occur. This causes the second half word to propagate to beneath electrode 60-4. Now, at time $t_7$, when the next $\phi_{C2}$ pulse occurs, this half word passes to beneath the $\phi_{C2}$ electrodes of the output register. For example, the charge stored in channel 68 passes from beneath electrode 60-4 to beneath electrode 70b via the path beneath electrode 70a. While not necessary, if desired to simplify the clock pulse circuits, a pulse G-2C (shown in phantom) may be applied a short time later (time $t_8$). No charge is available to be moved by this pulse but the pulse stream is now more symmetrical and the clock pulse circuit is simpler. In any case, the second half word now in the output register subsequently is propagated out of this register by successive $\phi_{C1}$, $\phi_{C2}$ pulses.

While the invention has been discussed in terms of two-phase and four-phase systems, it is to be appreciated that it is equally applicable to three-phase systems. FIG. 8 illustrates such an embodiment. The showing is somewhat schematic. In practice, the gaps between electrodes would be small, or the electrodes would overlap. The gate electrodes may be all polysilicon, or all metal. The drawing shows the so-called doped polysilicon gates in which the electrodes are defined as the doped regions of polysilicon and the gaps are the undoped regions of polysilicon.

The input gate means is shown in more detail than in FIG. 1 and comprises two gate electrodes 80-1 and 80-2 operated by two control voltages G-1A and G-1B, respectively. The output gate means comprises three separate gate electrodes 82-1, 82-2 and 82-3 operated by three control voltages G-2A, G-2B and G-2C. The second control voltage G-2B is a dc voltage level which may be about one half the amplitude of the pulses G-2A and G-2B. As the substrate beneath gate electrode 82-2, driven by the G-2B half-amplitude dc voltage level, must store the same amount of charge as the other two gate electrodes 82-1 and 82-3, electrode 82-2 is made double the width of these other electrodes. In addition, the storage area under the electrodes in the output register 18 is made double the storage area under electrode 82-3 to insure complete charge transfer to the output register using a "drop clock" transfer.

Figure 9:
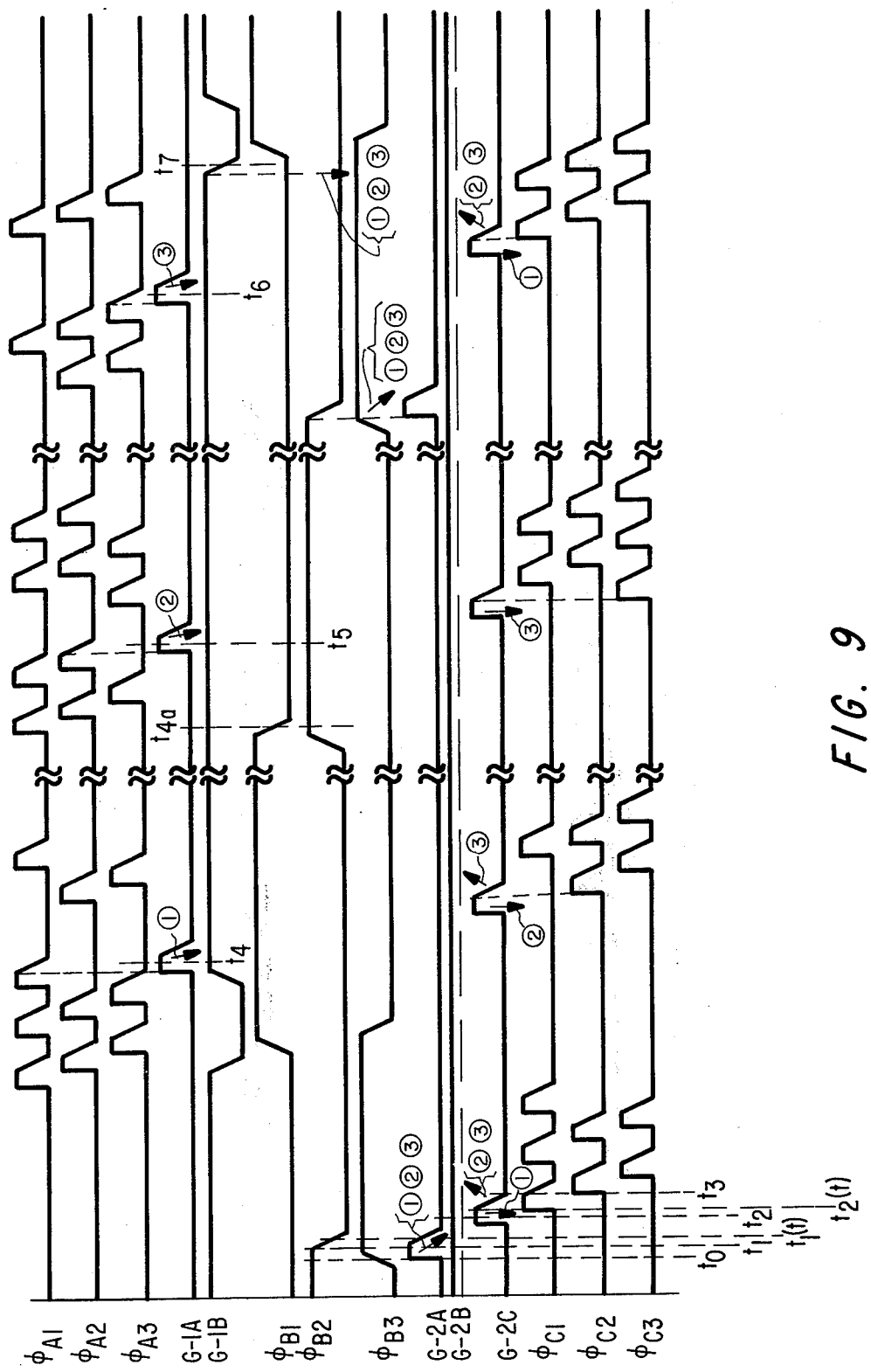
FIG. 9 is a drawing of waveforms to help explain the operation of the system of FIG. 8.

The operation of the embodiment of FIG. 8 is illustrated in FIG. 9. The numerals 1, 2 and 3 within the circles refer to the first third, the second third, and third third of a row of information. The pulses shown in FIG. 9 are positive pulses and this implies, for a surface channel CCD, that the minority carriers are electrons and the substrate is of P type.

The transfer of charge within the input register 10, the storage matrix 12, and the output register 18 is accomplished using the conventional "push clock" operation. The "push clock" operation corresponds to charge transfer by overlapping clock pulses. For an N-channel CCD, the charge is transferred into a potential well under an electrode with a positive clock pulse during the time when the clock voltage applied to the preceeding electrode decays from a positive voltage towards a smaller positive voltage. Thus, the charge is pushed out from the preceeding potential well during the fall time of the clock voltage pulse.

However, the transfer of charge signals from the storage matrix 12 to the output register 18 via the output gate structure 82-1, 82-2, 82-3 utilizes a form of "drop clock" operation as well as the conventional "push clock" operation. In the general case of a "drop clock" operation, the transfer of charge signal from a potential well is accomplished by making the succeeding potential well deep enough to remove all charge from the preceeding well while the clock pulse is not being applied to the electrode of that preceeding well. For example, in the case of a 2-phase N-channel CCD with asymmetrical potential wells, "drop clock" operation may be obtained with non-overlapping positive clock pulses applied to the 2 phases. As subsequently explained in reference to FIG. 10, a form of "drop clock" operation may be used in the case of 3 phase symmetrical gate devices by applying a dc bias voltage to one of the gates and having a value approximately half way between the maximum and minimum clock voltage levels employed to drive the other gate electrodes.

Figure 10:
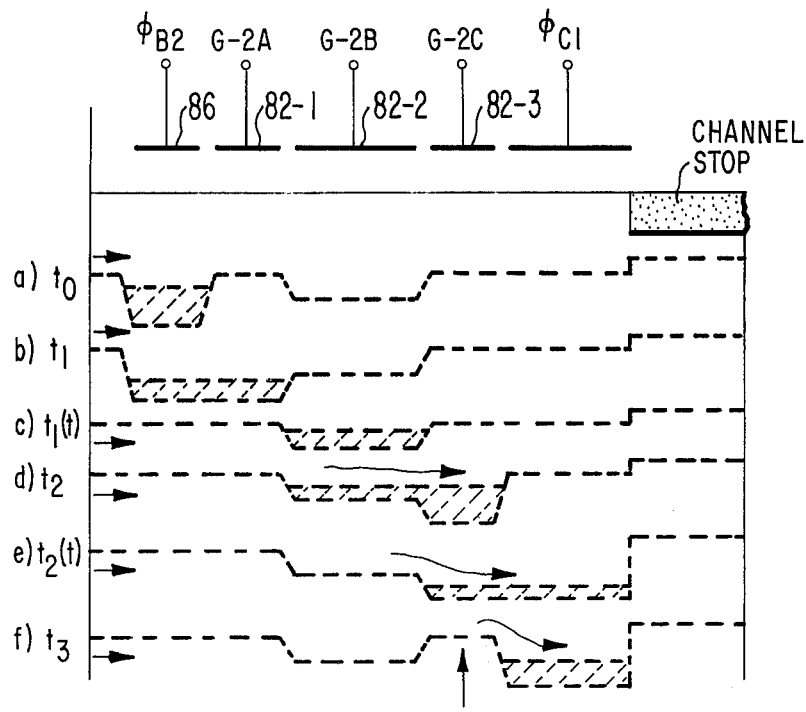
FIG. 10 illustrates surface potential profiles obtained during the operation of the arrangement of FIG. 8.

Referring now to FIGS. 8, 9 and 10, at time $t_0$ a full word is assumed to be present beneath the last electrode 86 of the matrix 12. A short time later at time $t_1$ the pulse G-2A has caused the transfer of this full word to beneath electrode 82-1. A short time later and before time $t_2$, the pulse G-2A is removed and the full word thereupon transfers by the push-clock action to the shallow well beneath electrode 82-2. Almost immediately thereafter, the pulse G-2C occurs, and by the time $t_2$ this full word starts transferring to beneath electrode 82-3. While the G-2C pulse is present, the first $\phi_{C1}$ pulse occurs and this transfers one third of this word from beneath electrodes 82-2 and 82-3 to beneath the $\phi_{C1}$ electrodes. At time $t_3$ the pulse G-2C has terminated and by this time the remaining two thirds of the word has become stored beneath electrode 82-2. Thus, at this point, one third of the word is stored in the output register and the remaining two thirds of the word is stored beneath electrode 82-2. The transfer of charge from potential wells beneath G-2C electrodes to potential wells under the $\phi_{C1}$ electrodes is shown in more detail in FIG. 10. Note, the completion of charge transfer from potential wells under G-2C electrodes to wells under $\phi_{C1}$ electrodes involves a push clock operation which, in the case of the other two thirds word, leads to pushing the charge signals back into potential wells under the G-2B electrodes.

The successive $\phi_{C1}$, $\phi_{C2}$, $\phi_{C3}$ pulses now propagate the one third word down the output register to the output circuit of this register. Electrode 82-3 is at its quiescent value during this period and provides a potential barrier which acts like a channel stop in the sense that it isolates the one third word being propagated down the output register from the remaining two thirds of the word stored beneath electrode 82-2.

FIG. 9 shows how the process described above is repeated for the second third of the word and then for the third third of the word. Thus, the output word arriving at the last electrode 86 of the array is transferred to the output register 18 one third of a word at a time. Each third of a word received by the output register is propagated out of this register and electrode 82-3 operates to isolate the part of the word being propagated from the remaining part of the word stored beneath electrode 82-2.

FIG. 9 also illustrates how the input gate electrodes 80-1, 80-2 transfer the input word to the array 12, which transfer is done via conventional "push clock" operation. At time $t_4$, for example, which is assumed to be a time at which the first third of the word is present in the input register 10, the pulse G-1A occurs. This transfers this third of a word to beneath electrode 80-2. This one third of a word is stored in the $\phi_{A1}$ channels 90 and 91 beneath electrode 80-2.

At time $t_5$ after the second third of the word has been stored in the input register, the pulse G-1A again is applied to transfer the second third of the word to beneath the electrode 80-2. This third of the word will become stored in the $\phi_{A2}$ channels 92 and 94 beneath the electrode 80-2.

At time $t_6$ the pulse G-1A occurs again and in the manner already discussed, the third third of the word transfers to beneath electrode 80-2. This third is that which was present beneath the $\phi_{A3}$ electrodes of the input register and it transfers to the channels 95 and 96 beneath electrode 80-2.

Note, however, that at time $t_6$, the voltage $\phi_{B3}$ is positive so that the charge signals in all three thirds of the word are present under both electrodes 80-2 and 100. At time $t_7$, the transfer of charge to the potential wells under electrode 100 is completed when clock voltage G-1B returns to its less positive potential.

While in the various embodiments of the invention discussed, 1/N'th of an output register stage aligns with each channel, where N is the number of phases, in some circumstances another mode of operation is possible. In a three phase system, for example, it is sometimes desirable to provide for each output stage two-thirds of a register stage rather than one-third of such a stage.

Figure 12:
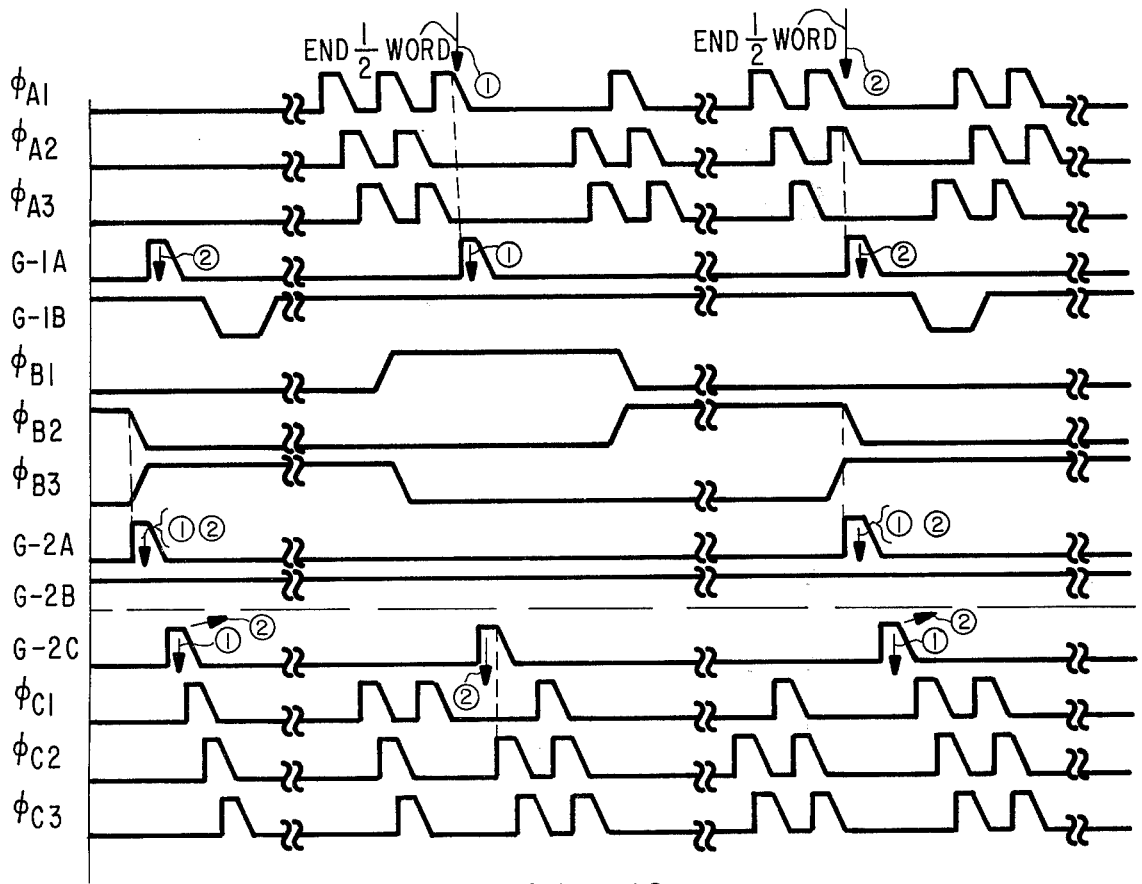
FIG. 12 is a drawing of waveforms to help explain the operation of the embodiment of FIG. 1.
Figure 11:
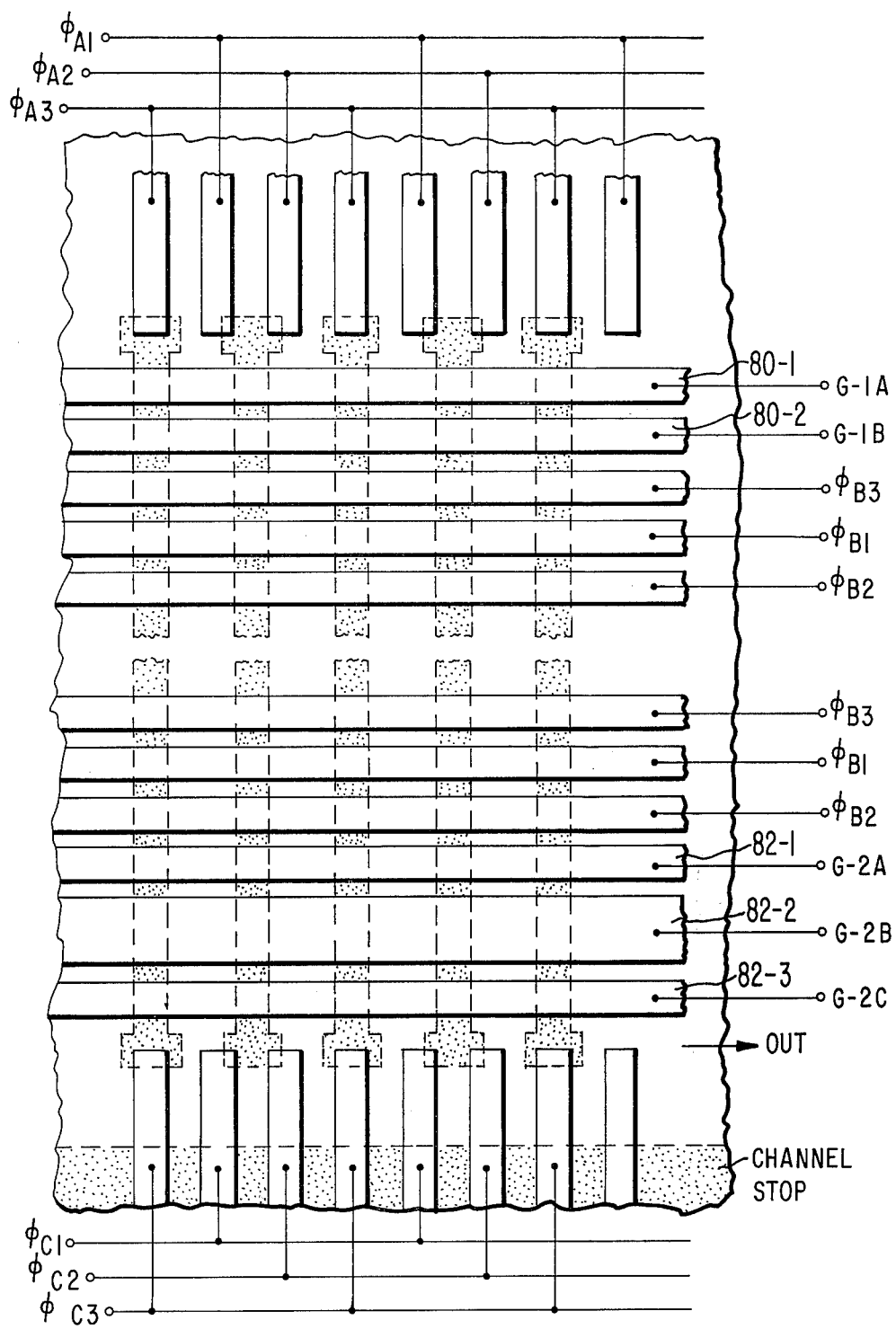
FIG. 11 is a schematic showing of a memory embodying another form of the invention.

While the invention has been described for the case in which each channel of the storage matrix aligns with 1/N'th of a serial register stage, it is also possible to align less than N channels (but more than 1) to each serial register stage. This may be desirable in order to obtain better high frequency performance in the serial registers by using phase fingers of narrower width while utilizing a somewhat wider channel in the storage matrix. An embodiment of this type using 2 channels in the matrix for each 3-phase stage is shown in FIGS. 11 and 12.

Information is divided into two half-words which are stored under alternate channels in the matrix. During the first half-cycle, the first word is clocked into the input register. This half word is then transferred to the potential wells under electrode 80-1 from potential wells under the $\phi_{A1}$ electrode of the input register using conventional "push clock" operation. In a similar manner, the second half-word is clocked into the input register and then transferred from potential wells under $\phi_{A2}$ electrodes to the remaining potential wells under electrode 80-1. Note that data is not transferred from potential wells under the $\phi_{A3}$ electrodes to the storage matrix.

The de-multiplexing of these two half-words in the output gate structure comprising 82-1, 82-2 and 82-3 is similar to that described previously for the case of a 3-phase system using a combination of "push" and "drop" clocks with G-2B operating with a CD bias level.

We claim:

1. A charge-coupled device structure comprising in combination:
   a semiconductor substrate formed with a plurality of channels along which charge may be propagated, said channels extending in the column direction;
   a storage electrode extending in the row direction with fingers over alternate of said channels extending in the column direction;
   a first gate electrode extending in the row direction adjacent to said storage electrode and lying over said fingers;
   a second gate electrode extending in the row direction, adjacent to said first gate electrode and lying over the ends of said fingers;
   a third gate electrode extending in the row direction, adjacent to said second gate electrode, said third gate electrode formed with fingers extending in the column direction over the remaining alternate channels, interleaving with the fingers of the storage electrode, passing beneath said second gate electrode and with the ends of said fingers extending to beneath said first electrode; and a fourth gate electrode adjacent to said third gate electrode, all of said electrodes being insulated from and electrically coupled to said substrate and each such electrode being insulated from but closely spaced to the next adjacent electrode.

2. A charge-coupled device structure as set forth in claim 1, further including:
a charge coupled device register comprising a plurality of electrodes coupled to said substrate including one over each channel, the electrodes over said channels all being coupled, at one edge, to said fourth gate electrode.

3. A charge transfer memory comrising, in combination:
a matrix of charge coupled device storage elements arranged in columns and rows, said matrix including a semiconductor substrate, electrodes extending in the row direction, and channels extending in the column direction, the last electrode in said matrix comprising a first conductor extending in the row direction and conducting fingers, one over each channel of a first group of alternate channels, extending in the channel direction;
a first control electrode comprising a second conductor extending in the row direction and conducting fingers, interleaved with the conducting fingers of said last electrode of said matrix, and lying over the remaining alternate channels, respectively, of said array;
a second control electrode lying over the ends of the fingers of said first conductor and over the first conductor of said first control electrode, and over the space therebetween for controlling the transfer of charge signals in said remaining alternate channels from regions of said substrate beneath said last electrode to regions of said substrate beneath said first control electrode; and
a third control electrode lying over the ends of the fingers of said last electrode and over the second conductor of said first control electrode, and over the space therebetween for controlling the transfer of charge signals in said first group of alternate channels from regions of said substrate beneath said last electrode to regions of said substrate beneath said first control electrode.

4. A charge transfer memory as set forth in claim 9 wherein said matrix of charge coupled devices is one which is four-phase operated, that is, is one in which every fourth row of the array is operated by a different voltage phase, and further including:
means for storing charge signals in said array comprising means for shifting information signals into only three of each group of four rows, the fourth row of each group remaining empty.

5. A method of operating a charge transfer memory array which is four phase operated and which has at least 4N rows, where N is an integer substantially greater than 1, comprising the steps of:
1. loading the first row of the array with a first group of information bits;
2. shifting the contents of the first row of each group of four rows to the second row of each said group of rows of the array;
3. loading first row of the array with a second group of information bits;
4. shifting the contents of the second row of each group of four rows to the third row of each said group of four rows of the array and then the contents of the first row of each said group of four rows to the second row of each said group of four rows of the array;
5. loading the first row of the array with a third group of information bits;
6. shifting the contents of the third row of each group of four rows to the fourth row of each said group of four rows of the array, then the contents of the second of each said group of four rows to the third row of each said group of four rows of the array, and then the contents of the first row of each said group of four rows to the second row of each said group of four rows of the array;
7. loading the first row of the array with all zeros;
8. shifting the contents of the fourth row of each group of four rows to the first row of each following group of four rows of the array, then the contents of the third row of each group of four rows to the fourth row of each said group of four rows of the array, then the contents of the second row of each group of four rows to the third row of each said group of four rows of the array, then the contents of the first row of each group of four rows of the array to the second row of each said group of four rows of the array; and
9. repeating steps 1 to 8 as many times as required to transfer a desired block of information to the memory.

* * * * *

UNITED STATES PATENT OFFICE
CERTIFICATE OF CORRECTION

PATENT NO. : 3,967,254
DATED : June 29, 1976
INVENTOR(S) : Walter Frank Kosonocky and Donald Jon Sauer It is certified that error appears in the above-identified patent and that said Letters Patent are hereby corrected as shown below:

Column 2, line 55, after "$\phi_{B3}$" there should be a comma.

Column 3, line 53, "16 b," should be --16b,--.

Column 9, line 13, "comrising" should be --comprising--.

Column 9, line 47, "claim 9" should be --claim 3--.

Signed and Sealed this

Fourteenth Day of September 1976

[SEAL]

Attest:

RUTH C. MASON
*Attesting Officer*

C. MARSHALL DANN
*Commissioner of Patents and Trademarks*